US012654581B2

(12) United States Patent
Zhou et al.

(10) Patent No.: US 12,654,581 B2
(45) Date of Patent: Jun. 16, 2026

(54) CHARGE CONTROL DEVICE

(71) Applicant: DENSO CORPORATION, Kariya-city (JP)

(72) Inventors: Bo Zhou, Kariya-city (JP); Junmin Cao, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 701 days.

(21) Appl. No.: 18/158,014

(22) Filed: Jan. 23, 2023

(65) Prior Publication Data

US 2023/0158915 A1 May 25, 2023

Related U.S. Application Data

(63) Continuation of application No. PCT/JP2021/037022, filed on Oct. 6, 2021.

(30) Foreign Application Priority Data

Oct. 22, 2020 (JP) ................................. 2020-177457

(51) Int. Cl.
*B60L 53/62* (2019.01)
*H02J 7/04* (2006.01)
(Continued)

(52) U.S. Cl.
CPC ............... *B60L 53/62* (2019.02); *H02J 7/04* (2013.01); *H02J 7/94* (2026.01); *H02J 7/96* (2026.01); *B60L 58/15* (2019.02); *B60L 2240/547* (2013.01); *B60L 2240/549* (2013.01); *B60L 2240/80* (2013.01); *G01R 31/3648* (2013.01); *G01R 31/367* (2019.01); *H01M 10/44* (2013.01);
(Continued)

(58) Field of Classification Search
CPC .... H02J 7/007182; H02J 7/00714; H02J 7/04; B60L 53/62
USPC ...................................................... 320/109, 160
See application file for complete search history.

(56) References Cited

U.S. PATENT DOCUMENTS 4,270,080 A * 5/1981 Kostecki ........... H02J 7/007184
320/160
5,179,335 A * 1/1993 Nor ................... H02J 7/007186
320/DIG. 19
(Continued)

FOREIGN PATENT DOCUMENTS

EP       2436551 A2    4/2012
JP       H09-084274 A  3/1997
(Continued)

*Primary Examiner* — John T Trischler
(74) *Attorney, Agent, or Firm* — Oliff PLC

(57) ABSTRACT

A charge control device is mounted on a vehicle to which external power for charging a storage battery is supplied from an external power supply. The charge control device has an acquisition part, a calculation part, and an output part. The acquisition part acquires a detection result of a physical quantity sensor that detects a physical quantity related to charging of the storage battery. The calculation part changes a target value of the physical quantity when a charge amount of the storage battery is equal to or greater than a target charge quantity and a difference between the target value of the physical quantity and the detection result is lower than a predetermined value. The output part outputs an instruction signal including an instruction to control an external power based on a target value to the external power supply.

7 Claims, 5 Drawing Sheets

(51) Int. Cl.
| | |
|---|---|
| *H02J 7/94* | (2026.01) |
| *H02J 7/96* | (2026.01) |
| *B60L 58/15* | (2019.01) |
| *G01R 31/36* | (2020.01) |
| *G01R 31/367* | (2019.01) |
| *H01M 10/44* | (2006.01) |
| *H01M 10/48* | (2006.01) |
| *H02J 7/82* | (2026.01) |
| *H02J 7/90* | (2026.01) |

(52) U.S. Cl.
CPC ............... *H01M 10/48* (2013.01); *H02J 7/82* (2026.01); *H02J 7/971* (2026.01)

(56) References Cited

U.S. PATENT DOCUMENTS

| | | | | |
|---|---|---|---|---|
| 5,204,611 | A * | 4/1993 | Nor | B60L 53/11 320/155 |
| 5,349,281 | A * | 9/1994 | Bugaj | H02J 7/00047 320/160 |
| 5,367,244 | A * | 11/1994 | Rose | H02J 7/007184 320/141 |
| 5,391,974 | A * | 2/1995 | Shiojima | H02J 7/007194 320/155 |
| 5,442,274 | A * | 8/1995 | Tamai | H02J 7/00711 320/160 |
| 5,477,126 | A * | 12/1995 | Shiojima | H02J 7/007194 320/160 |
| 5,477,127 | A * | 12/1995 | Shiojima | H02J 7/007194 320/155 |
| 5,483,145 | A * | 1/1996 | Shiojima | H02J 7/007194 320/155 |
| 5,497,068 | A * | 3/1996 | Shiojima | H02J 7/007194 320/155 |
| 5,550,453 | A * | 8/1996 | Bohne | H02J 7/007184 320/152 |
| 5,633,576 | A * | 5/1997 | Rose | H02J 7/007184 320/160 |
| 5,969,505 | A * | 10/1999 | Okamura | H02J 7/345 320/122 |
| 6,232,744 | B1 * | 5/2001 | Kawai | G01R 31/396 320/132 |
| 6,414,465 | B1 * | 7/2002 | Banks | H01M 10/48 320/160 |
| 7,208,915 | B2 * | 4/2007 | Kubota | H02J 7/007182 320/134 |
| 7,221,125 | B2 * | 5/2007 | Ding | H02J 7/00711 320/139 |
| 7,453,239 | B2 * | 11/2008 | Suzuki | H02J 7/04 323/247 |
| 7,535,195 | B1 * | 5/2009 | Horovitz | H02J 7/0068 320/141 |
| 7,728,559 | B2 * | 6/2010 | Suzuki | H02J 7/04 323/283 |
| 7,834,591 | B2 * | 11/2010 | Hussain | H02J 10/44 320/128 |
| 7,880,445 | B2 * | 2/2011 | Hussain | H02J 7/0071 320/164 |
| 8,030,902 | B2 * | 10/2011 | Kung | H01M 10/441 320/160 |
| 8,044,640 | B2 * | 10/2011 | Cruise | H02J 7/00712 320/137 |
| 8,193,780 | B2 * | 6/2012 | Hussain | H02J 7/0071 320/164 |
| 8,288,998 | B2 * | 10/2012 | Masuda | H02J 7/14 320/155 |
| 8,471,533 | B2 * | 6/2013 | Hussain | H02J 7/0071 320/164 |
| 8,610,408 | B2 * | 12/2013 | Nakai | H01M 10/48 320/160 |
| 8,643,342 | B2 * | 2/2014 | Mehta | H02J 7/0071 320/160 |
| 8,653,793 | B2 * | 2/2014 | Ueki | H01M 10/48 320/132 |
| 8,754,614 | B2 * | 6/2014 | Paryani | H01M 10/443 320/160 |
| 8,818,598 | B2 * | 8/2014 | Izumi | B60L 50/16 701/22 |
| 8,970,182 | B2 * | 3/2015 | Paryani | H02J 7/00 320/160 |
| 8,981,733 | B2 * | 3/2015 | Hussain | H02J 7/0071 320/164 |
| 9,219,368 | B2 * | 12/2015 | Kurokawa | H02J 7/007182 |
| 9,300,157 | B2 * | 3/2016 | Bergqvist | B60L 1/006 |
| 9,419,450 | B2 * | 8/2016 | Paryani | H01M 10/443 |
| 9,564,776 | B2 * | 2/2017 | Lampinen | H02J 50/70 |
| 9,728,995 | B2 * | 8/2017 | Matsumura | H02J 7/0029 |
| 9,929,581 | B2 * | 3/2018 | Takano | H02J 7/00714 |
| 9,929,582 | B2 * | 3/2018 | Matsumura | H02J 7/00 |
| 9,966,767 | B2 * | 5/2018 | Tatsumoto | H02J 7/007 |
| 10,286,789 | B2 * | 5/2019 | Nagakura | H02J 7/00302 |
| 10,291,046 | B2 * | 5/2019 | Ravi | H02J 7/0045 |
| 10,322,645 | B2 * | 6/2019 | Murata | B60L 58/13 |
| 10,389,151 | B2 * | 8/2019 | Ravi | H02J 7/007 |
| 10,434,890 | B2 * | 10/2019 | Uchida | G01R 31/44 |
| 10,449,870 | B2 * | 10/2019 | Chang | B60L 50/60 |
| 10,498,156 | B2 * | 12/2019 | Zhang | H02J 7/0071 |
| 10,875,418 | B2 * | 12/2020 | Ishida | H02M 7/5387 |
| 10,903,669 | B2 * | 1/2021 | Komiyama | H02J 7/00712 |
| 10,988,043 | B2 * | 4/2021 | Kimura | H02M 3/335 |
| 11,011,784 | B2 * | 5/2021 | Barde | H01M 12/08 |
| 11,095,135 | B2 * | 8/2021 | Thompson | G06F 1/1635 |
| 11,239,680 | B2 * | 2/2022 | El Markhi | H02J 7/00712 |
| 11,527,903 | B2 * | 12/2022 | Chen | H02J 50/10 |
| 11,552,493 | B2 * | 1/2023 | Chen | H02J 7/0013 |
| 11,858,370 | B2 * | 1/2024 | Matsuyama | B60L 50/60 |
| 11,926,235 | B2 * | 3/2024 | Zhou | B60L 9/00 |
| 11,996,714 | B2 * | 5/2024 | El Markhi | H02J 7/007192 |
| 12,027,905 | B2 * | 7/2024 | Zhang | H02J 7/00716 |
| 12,388,286 | B2 * | 8/2025 | Zhou | H02J 7/0048 |
| 12,394,999 | B2 * | 8/2025 | Yao | H02J 7/00032 |
| 2005/0093517 | A1 | 5/2005 | Suzuki | |
| 2005/0099162 | A1 * | 5/2005 | Ding | H02J 7/00711 320/141 |
| 2006/0076921 | A1 * | 4/2006 | Kubota | H02J 7/00714 320/107 |
| 2007/0188134 | A1 * | 8/2007 | Hussain | H02J 7/0071 320/114 |
| 2007/0188139 | A1 * | 8/2007 | Hussain | H02J 7/0071 320/128 |
| 2008/0309293 | A1 * | 12/2008 | Kung | H02J 7/0071 320/160 |
| 2009/0039837 | A1 | 2/2009 | Suzuki | |
| 2009/0309547 | A1 * | 12/2009 | Nakatsuji | H02J 7/06 320/164 |
| 2010/0079111 | A1 * | 4/2010 | Masuda | H02J 7/007194 320/152 |
| 2010/0085021 | A1 * | 4/2010 | Cruise | H02J 7/00712 320/162 |
| 2011/0012563 | A1 * | 1/2011 | Paryani | H01M 10/0525 320/162 |
| 2011/0025277 | A1 * | 2/2011 | Hussain | H02J 7/007182 320/163 |
| 2011/0089893 | A1 * | 4/2011 | Hussain | H02J 7/0071 320/107 |
| 2011/0156661 | A1 * | 6/2011 | Mehta | H02J 7/0071 320/160 |
| 2011/0199054 | A1 * | 8/2011 | Burchardt | H02J 7/007 320/139 |
| 2011/0316487 | A1 * | 12/2011 | Nakai | H01M 4/485 320/160 |
| 2012/0112754 | A1 * | 5/2012 | Kawai | B60L 58/16 324/427 |
| 2012/0169288 | A1 * | 7/2012 | Ueki | H01M 50/50 702/58 |
| 2012/0223682 | A1 * | 9/2012 | Hussain | H02J 7/0071 320/164 |
| 2013/0096760 | A1 | 4/2013 | Izumi | |

(56) References Cited

U.S. PATENT DOCUMENTS

| | | | | |
|---|---|---|---|---|
| 2013/0193924 A1* | 8/2013 | Kurokawa | ............... | H02J 7/04 |
| | | | | 320/112 |
| 2013/0257358 A1* | 10/2013 | Hussain | ............... | H02J 7/0071 |
| | | | | 320/162 |
| 2013/0314054 A1* | 11/2013 | Bergqvist | .......... | H02J 7/007182 |
| | | | | 320/162 |
| 2014/0125276 A1* | 5/2014 | Lampinen | ............... | H02J 50/80 |
| | | | | 320/108 |
| 2014/0253023 A1* | 9/2014 | Paryani | ................ | H01M 10/44 |
| | | | | 320/160 |
| 2015/0171644 A1* | 6/2015 | Paryani | ............ | H02J 7/007184 |
| | | | | 320/137 |
| 2015/0236524 A1 | 8/2015 | Takano et al. | | |
| 2015/0311731 A1* | 10/2015 | Tatsumoto | ............. | H02J 7/007 |
| | | | | 399/88 |
| 2016/0181830 A1* | 6/2016 | Matsumura | ............ | G06F 1/263 |
| | | | | 713/300 |
| 2016/0276843 A1* | 9/2016 | Chang | .................... | B60L 50/60 |
| 2016/0301226 A1* | 10/2016 | Matsumura | ........... | H02J 7/0029 |
| 2017/0057376 A1* | 3/2017 | Murata | ............... | H01M 10/625 |
| 2017/0274784 A1* | 9/2017 | Nagakura | ........... | H02J 7/00302 |
| 2017/0341520 A1* | 11/2017 | Chang | .................... | B60L 50/60 |
| 2018/0056809 A1* | 3/2018 | Uchida | .................. | B60L 58/22 |
| 2018/0145526 A1* | 5/2018 | Ravi | .................... | H02J 7/0069 |
| 2018/0145527 A1* | 5/2018 | Ravi | ................. | G01R 31/3842 |
| 2018/0205234 A1* | 7/2018 | Zhang | ................ | H02J 7/00718 |
| 2019/0023145 A1* | 1/2019 | Komiyama | ............... | H02J 7/00 |
| 2019/0044345 A1* | 2/2019 | Komiyama | ......... | H02J 7/00712 |
| 2019/0190278 A1* | 6/2019 | Chang | .................... | H02J 7/0071 |
| 2019/0241088 A1* | 8/2019 | Kimura | .................... | B60L 53/22 |
| 2019/0366865 A1* | 12/2019 | Morimoto | ............ | B60L 3/0069 |
| 2019/0372358 A1* | 12/2019 | El Markhi | ......... | H02J 7/00712 |
| 2020/0006817 A1* | 1/2020 | Barde | .................... | H01M 10/44 |
| 2020/0009980 A1* | 1/2020 | Ishida | .................... | B60L 53/14 |
| 2020/0136401 A1* | 4/2020 | Thompson | .......... | H02J 7/00304 |
| 2020/0231060 A1 | 7/2020 | Matsuyama et al. | | |
| 2020/0235601 A1* | 7/2020 | Chen | ........................ | H02J 50/10 |
| 2021/0078431 A1* | 3/2021 | Nagatochi | ............... | B60L 58/16 |
| 2021/0210970 A1* | 7/2021 | Chen | .................... | H02J 7/00714 |
| 2022/0029446 A1* | 1/2022 | Zhang | .................... | H02J 7/0048 |
| 2022/0105824 A1* | 4/2022 | Zhou | ...................... | B60L 53/20 |
| 2022/0115889 A1* | 4/2022 | El Markhi | ........ | H02J 7/007192 |
| 2022/0190626 A1* | 6/2022 | Yao | ................... | H02J 7/007182 |
| 2022/0224131 A1* | 7/2022 | Zhou | .................... | H02J 7/00714 |
| 2022/0278545 A1* | 9/2022 | Zhou | ...................... | B60L 53/62 |
| 2023/0173924 A1* | 6/2023 | Yamaguchi | .......... | H01M 10/44 |
| | | | | 320/162 |
| 2023/0216324 A1* | 7/2023 | Tang | .................... | H01M 10/425 |
| | | | | 320/162 |

FOREIGN PATENT DOCUMENTS

| | | | |
|---|---|---|---|
| JP | 2005318790 A | * | 11/2005 |
| JP | 2020-124033 A | | 8/2020 |

* cited by examiner

FIG. 2

CHARGE CONTROL DEVICE

CROSS REFERENCE TO RELATED APPLICATIONS

The present application is a continuation application of International Patent Application No. PCT/JP2021/037022 filed on Oct. 6, 2021, which designated the U.S. and claims the benefit of priority from Japanese Patent Application No. 2020-177457 filed in Japan filed on Oct. 22, 2020, the entire disclosure of the above application is incorporated herein by reference.

TECHNICAL FIELD

The disclosure described herein relates to a charge control device that controls a charge of a battery.

BACKGROUND

A charge system is known that includes a vehicle on which a battery and an ECU are mounted, and a charger that charges the battery.

SUMMARY

A charge control device suppresses an extension of charging time for a battery.

A charge control device according to an aspect of the present disclosure includes an acquisition part configured to acquire a detection result of a physical quantity sensor that detects a physical quantity related to charging of a storage battery mounted on a vehicle by external power output from an external power source, a calculation part configured to change a target value of the physical quantity when a charge amount of the storage battery is equal to or greater than a target charge quantity and a difference between the target value of the physical quantity and the detection result is lower than a predetermined value, and an output part configured to output an instruction signal including an instruction to control the external power based on the target value of the physical quantity to the external power supply.

BRIEF DESCRIPTION OF DRAWINGS

FIG. 2 is a timing chart for explaining changes over time in closed circuit voltage, actual current, and target current when external power is supplied;

DETAILED DESCRIPTION

Figure 1:
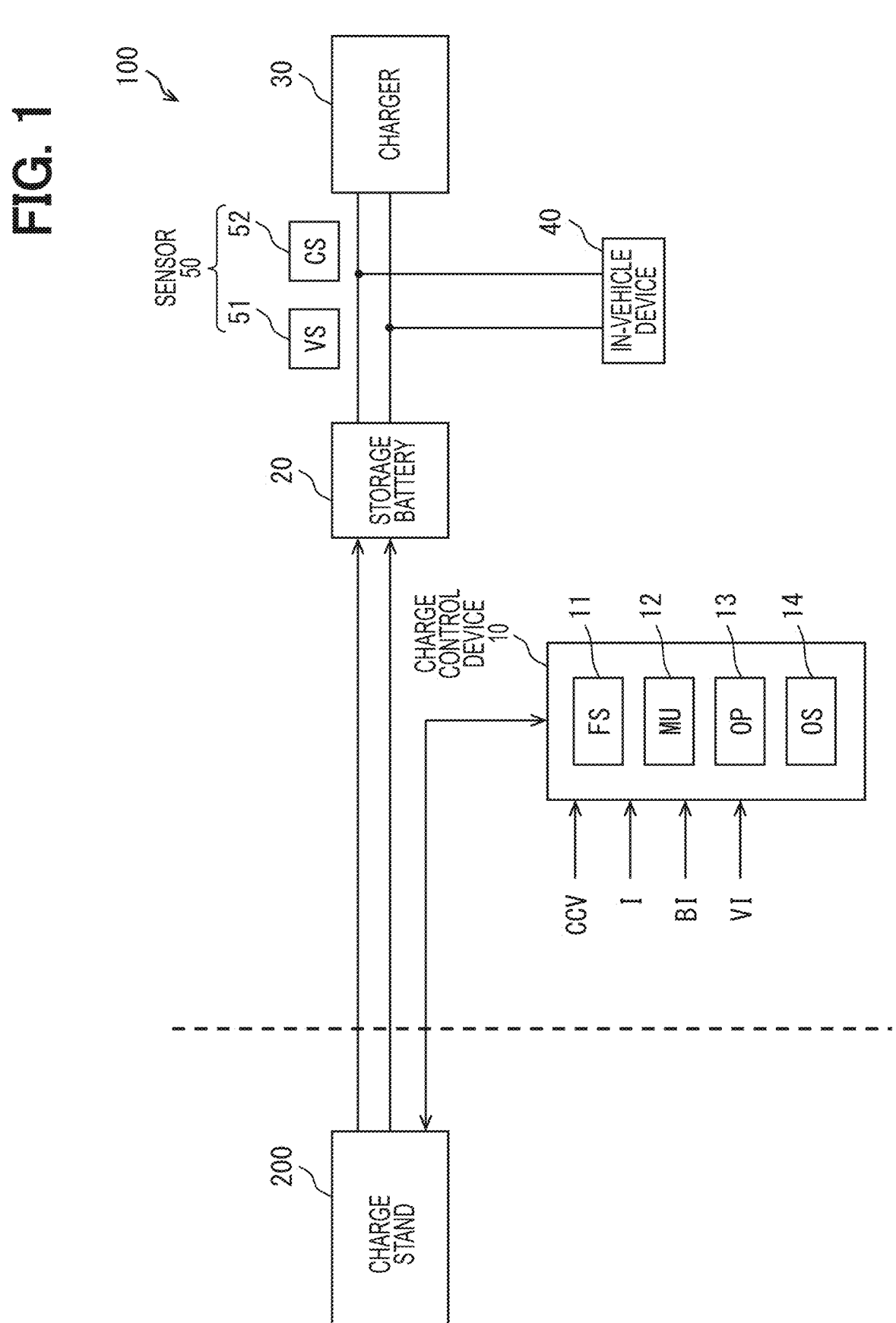
FIG. 1 is a block diagram showing a charge control system mounted on an electric vehicle.

In an assumable example, a charging system is known that includes a vehicle on which a battery and an ECU are mounted, and a charger that charges the battery. The ECU changes a command value output to the charger. The ECU detects a reaction time of the charger to changes in command values.

The ECU of the charge system sets a margin for preventing overcharge based on the detected reaction time. The ECU determines a command value related to battery charging after setting the margin based on this margin. Due to the determination of such a command value, the charge time of the battery (storage battery) may be excessively extended depending on a value of the reaction time used to determine the margin.

A charge control device suppresses an extension of charging time for a battery.

A charge control device according to an aspect of the present disclosure includes an acquisition part configured to acquire a detection result of a physical quantity sensor that detects a physical quantity related to charging of a storage battery mounted on a vehicle by external power output from an external power source, a calculation part configured to change a target value of the physical quantity when a charge amount of the storage battery is equal to or greater than a target charge quantity and a difference between the target value of the physical quantity and the detection result is lower than a predetermined value, and an output part configured to output an instruction signal including an instruction to control the external power based on the target value of the physical quantity to the external power supply.

According to this configuration, the external power is controlled based on an actual dynamic response of the external power supply when the charge amount of the storage battery is equal to or greater than the target charge amount. Therefore, it is possible to suppress the extension of the charging time of the storage battery, compared to, for example, a configuration in which the external power is controlled based on a temporary response of the external power supply.

The following will describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each form, the other forms described above can be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

A charge control system 100 will be described based on FIGS. 1 to 4. The charge control system 100 is mounted on an electric vehicle such as an electric automobile or a hybrid automobile.

A charge stand 200 positioned outside the electric vehicle is connected to the charge control system 100. As a result, DC external power is supplied from the charge stand 200 to the charge control system 100. In FIG. 1, a boundary between the electric vehicle and the outside thereof is shown by a broken line. The charge stand 200 corresponds to an external power supply.

The charge control system 100 includes a charge control device 10, a storage battery 20, a charger 30, a in-vehicle device 40, and a physical quantity sensor 50. The storage battery 20 of the charge control system 100 is charged with the external power supplied from the charge stand 200. In the drawing, the storage battery 20 is referred to as SB. The charger 30 is referred to as BC. The in-vehicle device 40 is referred to as VM. The charge stand 200 is referred to as CS.

The charge control device 10 is referred to as EVECU. EV is an abbreviation of an Electric Vehicle. ECU is an abbreviation of an Electronic Control Unit. The charge control device 10 controls driving of the charge stand 200. Thereby, the charge control device 10 controls charging of the storage battery 20.

The storage battery 20 has a plurality of secondary batteries connected in series. A lithium ion battery, for example, can be employed as the secondary batteries. The output power of the storage battery 20 is input to the charger 30 and the in-vehicle device 40, respectively.

The charger 30 is a power converter including an inverter. The charger 30 converts the DC output power input from the storage battery 20 into AC power. This AC power is supplied to a motor (not shown). This motor is connected to the running wheels via a vehicle axle. The charger 30 converts AC power generated by the motor into DC power. This DC power is supplied to the storage battery 20.

The in-vehicle device 40 is a power load of an air conditioner, or the like. When the charge stand 200 is connected to the electric vehicle, the electric vehicle is in a stopping state. At this time, an in-vehicle accessory such as an air conditioner that are driven by a low voltage can be switched between a driving state and a non-driving state.

A physical quantity sensor 50 detects a physical quantity associated with charging of the storage battery 20. The physical quantity sensor 50 has a voltage sensor 51 and a current sensor 52. The voltage sensor 51 detects the voltage output from the storage battery 20. The current sensor 52 detects the current flowing through the storage battery 20. These voltages and currents change when the storage battery 20 is charged. The detection results of the voltage sensor 51 and the current sensor 52 are input to the charge control device 10. In the drawing, the voltage sensor 51 is referred to as VS. The current sensor 52 is referred to as CS.

<OCV, CCV, SOC>

The storage battery 20 has an internal resistance. Therefore, there is a difference due to voltage drop according to this internal resistance and the current flowing through the storage battery 20 between the actual output voltage corresponding to the SOC of the storage battery 20 and the output voltage detected by the voltage sensor 51.

Hereinafter, the actual output voltage corresponding to the SOC of the storage battery 20 will be referred to as an open circuit voltage OCV as required. The output voltage detected by the voltage sensor 51 is referred to as a closed circuit voltage CCV. The resistance in the storage battery 20 is referred to as an internal resistance R, and the current that actually flows through the storage battery 20 is referred to as an actual current I. OCV is an abbreviation for Open Circuit Voltage. CCV is an abbreviation for Closed Circuit Voltage. SOC is an abbreviation for State Of Charge. SOC corresponds to the amount of charge.

A relationship between the closed circuit voltage CCV and the open circuit voltage OCV is expressed as CCV=OCV±I×R. When the storage battery 20 is discharged, the above relationship is expressed as CCV=OCV−I×R. When the storage battery 20 is charged, the above relationship is expressed as CCV=OCV+I×R. As described above, there is a difference of the voltage drop I×R between the closed circuit voltage CCV and the open circuit voltage OCV regardless of whether the storage battery 20 is discharged or charged.

The closed circuit voltage CCV is detected by the voltage sensor 51, and the closed circuit voltage CCV is higher than the open circuit voltage OCV by the voltage drop I×R when the storage battery 20 is being charged. The actual current I included in the voltage drop can be detected by the current sensor 52, but the internal resistance R of the storage battery 20 fluctuates due to temperature and aging deterioration. Therefore, it is difficult to calculate the voltage drop I×R with high accuracy. It has become difficult to accurately determine the SOC of the storage battery 20 based on the open circuit voltage OCV.

Therefore, the charge control device 10 first charges the storage battery 20 until the closed circuit voltage CCV reaches the target voltage, as will be described in detail later. After that, the charge control device 10 gradually decreases the actual current I flowing through the storage battery 20 while maintaining the closed circuit voltage CCV at the target voltage. This control minimizes the difference between the closed circuit voltage CCV and the open circuit voltage OCV. The SOC of the storage battery 20 is as close as possible to the SOC when the circuit voltage OCV is the target voltage.

<Charge Control Device>

As shown in FIG. 1, the charge control device 10 has an acquisition part 11, a storage part 12, a calculation part 13, and an output part 14. In the drawing, the acquisition part 11 is referred to as FS. The storage part 12 is referred to as MU. The calculation part 13 is referred to as OP. The output part 14 is written as OS.

Various information is input to the acquisition part 11 from the physical quantity sensor 50 and other various ECUs and various sensors (not shown). That is, the closed circuit voltage CCV and the actual current I are input from the physical quantity sensor 50 to the acquisition part 11. Various types of information such as battery information including the capacity of the storage battery 20 and vehicle information including the driving state of the electric vehicle are input to the acquisition part 11 from various ECUs and various sensors. In the drawing, the battery information is referred to as BI. The vehicle information is referred to as VI.

The storage part 12 is a non-transitional substantive storage medium that non-temporarily stores programs that can be read by a computer or a processor. Various information acquired by the acquisition part 11 and processing results of the calculation part 13 are stored in the storage part 12. In addition, the storage part 12 stores determination values in advance for the calculation processing by the calculation part 13.

The calculation part 13 has a processor. The calculation part 13 executes various calculation processing based on the information stored in the storage part 12. The calculation part 13 generates an instruction signal for instructing the operation of the charge stand 200 based on the information stored in the storage part 12. The instruction signal includes a target voltage that determines the value of the voltage included in the external power output from the charge stand 200 to the storage battery 20, and a target current that determines the amount of current included in the external power output. The target current corresponds to the target value of the physical quantity.

The target voltage is determined according to the capacity of the storage battery 20 mounted on the electric vehicle. The target voltage is determined based on the OCV when the SOC of the storage battery 20 is fully charged. When the closed circuit voltage CCV reaches the target voltage by rapid charge processing, the SOC of the storage battery 20 is expected to reach approximately 80%. The SOC of the storage battery 20 when the closed circuit voltage CCV reaches the target voltage by this rapid charge processing corresponds to the target charge amount.

The output part 14 outputs various electric signals including the results of calculation processing performed by the calculation part 13. The output part 14 outputs the instruction signal generated by the calculation part 13 to the charge stand 200. The charge stand 200 outputs external power output to the storage battery 20 based on the target voltage and target current included in the instruction signal.

<Charge Processing>

Figure 3:
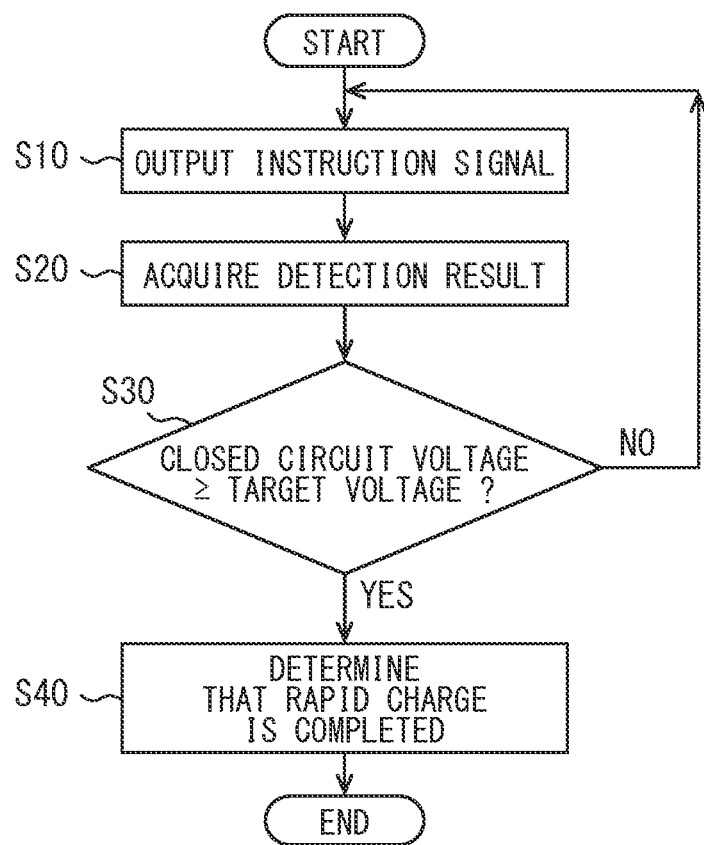
FIG. 3 is a flowchart for explaining rapid charge processing.

Next, the charge processing executed by the calculation part 13 will be described with reference to FIGS. 2 to 4. The charge processing includes a rapid charge processing and a full charge processing. When the charge stand 200 is electrically connected to the electric vehicle, the calculation part 13 executes the rapid charge processing. After this processing, the calculation part 13 executes the full charge processing.

First, based on FIG. 2, the rapid charge processing and the full charge processing will be explained. A vertical axis in FIG. 2 indicates an arbitrary unit, and a horizontal axis indicates a time. The arbitrary unit is referred to as au and the time is referred to as t. The closed circuit voltage CCV and the actual current I of the storage battery 20 are indicated by solid lines. A target voltage is referred to as TV, and a target current is referred to as TC. These target voltage and target current are indicated by dashed lines.

Figure 2:
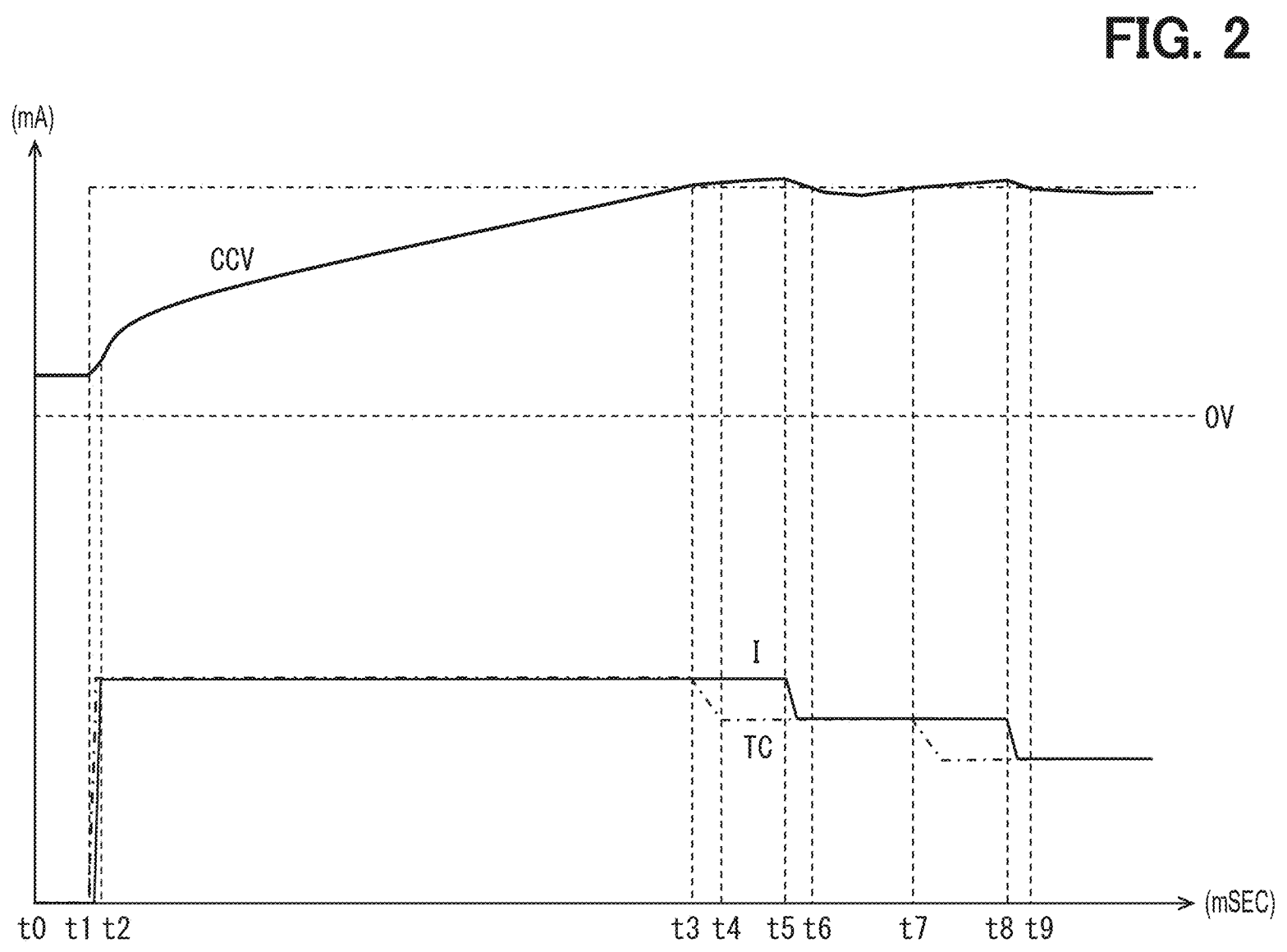

At time t0 in FIG. 2, the charge stand 200 is not electrically connected to the electric vehicle. Also, no current flows through the storage battery 20. Therefore, the target voltage, target current, and actual current I become each zero. Since electric charge is accumulated in the storage battery 20, the closed circuit voltage CCV has a predetermined value.

After a lapse of time from time t0 to time t1, the charging cable of the charge stand 200 is connected to the electric vehicle. At this time, the calculation part 13 starts executing the rapid charge processing. The calculation part 13 outputs an instruction signal including a target voltage and a target current as a control instruction to the charge stand 200.

In the rapid charge processing, the target voltage and target current are substantially constant. In order to realize rapid charge, the target current in the rapid charge processing is set high. This target current is determined according to how fast the storage battery 20 is to be rapidly charged. The target current during the rapid charge processing is hereinafter referred to as the initial target current. This initial target current is included in the instruction signal output from the charge control device 10 to the charge stand 200 at time t1 shown in FIG. 2.

The closed circuit voltage CCV fluctuates depending on the resistance of the storage battery 20 and the like, but the target voltage in the rapid charge processing is a value indicating that the SOC of the storage battery 20 is about 80% when the closed circuit voltage CCV is the target voltage. In the present embodiment, the target voltage during the rapid charge processing is equal to the target voltage during the full charge processing. Using the open circuit voltage OCV, the target voltage in the full charge processing is such that the SOC of the storage battery 20 is about 100% when the open circuit voltage OCV is the target voltage. The SOC value of about 100% is a value lower than the SOC of the storage battery 20 in an overcharged state. After time t1, the target voltage is included in the instruction signal output from the charge control device 10 to the charge stand 200.

After the elapse of time from time t1 to time t2, the target current becomes the initial target current. Following this processing, the amount of external power supplied from the charge stand 200 to the storage battery 20 increases sharply. The actual current I flowing through the storage battery 20 becomes the initial target current.

The SOC of the storage battery 20 increases due to the supply of such external power. Along with this increase, the closed circuit voltage CCV of the storage battery 20 increases.

When time t3 is reached, the closed circuit voltage CCV exceeds the target voltage. When the calculation part 13 detects this condition, it switches from the rapid charge processing to the full charge processing. The calculation part 13 calculates a target current with a current value lower than the initial target current. The calculation part 13 outputs an instruction signal including the target current to the charge stand 200. Hereinafter, this target current will be referred to as a first target current.

After the elapse of time from time t3 to time t4, the target current becomes the first target current. However, the actual current I does not decrease due to the response delay of the charge stand 200. The closed circuit voltage CCV continues to rise due to the increase in the SOC of the storage battery 20.

At time t5, the current amount of the external power output from the charge stand 200 becomes the current amount based on the first target current. Therefore, the actual current I begins to decrease. Along with this decrease, the closed circuit voltage CCV also begins to decrease.

After the elapse of time from time t5 to time t6, the closed circuit voltage CCV falls below the target voltage. Upon detecting this condition, the calculation part 13 maintains the target current at the first target current. As a result, the actual current I also becomes constant at the first target current.

After time t5, the SOC of storage battery 20 continues to improve even if the closed circuit voltage CCV temporarily drops due to a decrease in the amount of current supplied. Therefore, the closed circuit voltage CCV rises again as the SOC of the storage battery 20 improves.

After the time t7 is reached from time t6, the closed circuit voltage CCV exceeds the target voltage again. When the calculation part 13 detects this condition, it sets the target current to a second target current whose current value is lower than the previously set first target current. The calculation part 13 outputs an instruction signal including the second target current to the charge stand 200.

After that, at time t8, the actual current I begins to decrease due to the response of the charge stand 200 based on the input second target current. Along with this decrease, the closed circuit voltage CCV begins to decrease.

After the elapse of time from time t8 to time t9, the closed circuit voltage CCV falls below the target voltage. Upon detecting this condition, the calculation part 13 maintains the target current at the second target current. As a result, the actual current I also becomes constant at the second target current.

Hereinafter, although illustration and description are omitted, the target current is gradually decreased according to the actual dynamic response of the charge stand 200 while continuing to charge the storage battery 20 by keeping the closed circuit voltage CCV close to the target voltage. By controlling so, the difference between the closed circuit voltage CCV detected by the voltage sensor 51 and the open circuit voltage OCV corresponding to the actual SOC of the storage battery 20 is minimized. The SOC of the storage battery 20 is brought as close as possible to the SOC when the open circuit voltage OCV is the target voltage.

<Rapid Charge Processing>

Next, a rapid charge processing will be described based on FIG. 3. When the charging cable of the charge stand 200 is connected to the electric vehicle, the calculation part 13 starts executing this rapid charge processing.

In step S10, the calculation part 13 outputs an instruction signal including the target voltage and the initial target current to the charge stand 200. These target voltage and initial target current may be calculated based on the performance of the storage battery 20, the stored SOC, and the like when executing this rapid charge processing. Alternatively, the target voltage and the initial target current may be stored in the storage part 12 in advance. After outputting the instruction signal to the charge stand 200, in the calculation part 13, the process proceeds to step S20.

When proceeding to step S20, the calculation part 13 acquires the detection result of the physical quantity sensor 50 input to the acquisition part 11. That is, the calculation part 13 acquires the closed circuit voltage CCV and the actual current I of the storage battery 20. After this process, in the calculation part 13, the process proceeds to step S30.

When proceeding to step S30, the calculation part 13 compares the closed circuit voltage CCV acquired in step S20 with the target voltage included in the instruction signal in step S10. When the closed circuit voltage CCV is equal to or higher than the target voltage, in the calculation part 13, the process proceeds to step S40. When the closed circuit voltage CCV is lower than the target voltage, in the calculation part 13, the process returns to step S10. The calculation part 13 repeats steps S10 to S30 until the closed circuit voltage CCV becomes equal to or higher than the target voltage.

When proceeding to step S40, the calculation part 13 determines that the rapid charge has been completed. Then, the calculation part 13 ends the rapid charge processing and starts executing the full charge processing. This rapid charge processing corresponds to the processing from time t1 to time t3 in the example shown in FIG. 2. The full charge processing described below corresponds to the processing after time t3.

<Full Charge Processing>

Figure 4:
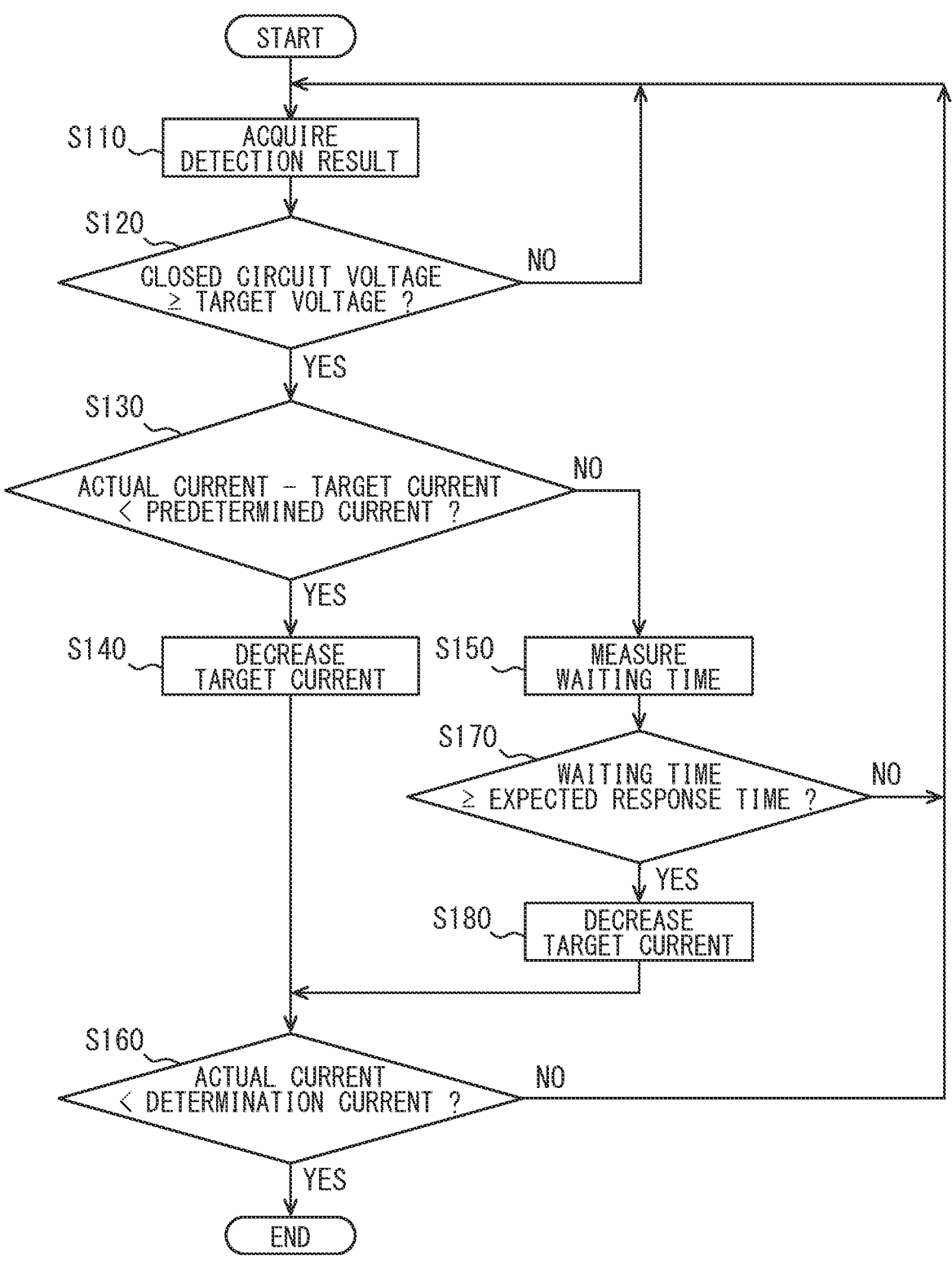
FIG. 4 is a flowchart for explaining full charge processing.

In step S110 shown in FIG. 4, the calculation part 13 acquires the closed circuit voltage CCV and the actual current I of the storage battery 20. After this process, in the calculation part 13, the process proceeds to step S120.

When proceeding to step S120, the calculation part 13 compares the closed circuit voltage CCV obtained in step S110 with the target voltage included in the output instruction signal. When the closed circuit voltage CCV is equal to or higher than the target voltage, in the calculation part 13, the process proceeds to step S130. When the closed circuit voltage CCV is lower than the target voltage, in the calculation part 13, the process returns to step S110. The calculation part 13 repeats steps S110 to S120 until the closed circuit voltage CCV becomes equal to or higher than the target voltage.

When proceeding to step S130, the calculation part 13 calculates a difference value by subtracting the target current from the actual current I acquired in step S110. Then, the calculation part 13 determines whether or not this difference value is lower than a predetermined current. When the difference value is lower than the predetermined current, the calculation part 13 permits the reduction of the target current, and proceeds to step S140. When the difference value is equal to or greater than the predetermined current, the calculation part 13 prohibits the reduction of the target current, and proceeds to step S150. This prohibition of reduction of the target current corresponds to unchanged the target value of the physical quantity.

The predetermined current is determined based on the performance of the charge stand 200, the detection accuracy of the current sensor 52, and the like. The performance of the charge stand 200 includes the responsiveness of the charge stand 200, the stability of changes over time in the current and voltage supplied from the charge stand 200, and the like. Therefore, the calculation part 13 may calculate the performance of the charge stand 200, for example, during the rapid charge processing, and determine the predetermined current based on the calculation result. Alternatively, the designer of the charge control device 10 may preliminarily calculate a predetermined current according to the performance of various charge stands 200 connected to the electric vehicle, and store it in the storage part 12. A predetermined current corresponds to a predetermined value. The actual current I corresponds to the physical quantity.

The closed circuit voltage CCV becomes to be equal to or higher than the target voltage when the rapid charge processing is finished and the full charge processing is started. At the same time, the difference value is lower than the predetermined current. Therefore, when the full charge processing is started, the calculation part 13 proceeds from step S120 to step S130. In the calculation part 13, the process proceeds from step S130 to step S140.

When proceeding to step S140, the calculation part 13 reduces the target current included in the instruction signal output to the charge stand 200. Then, in the calculation part 13, the process proceeds to step S160.

When proceeding to step S160, the calculation part 13 determines whether or not the actual current I is lower than a determination current. When the actual current I is lower than the determination current, the calculation part 13 terminates the full charge processing. The calculation part 13 cuts off the electrical connection between the charge stand 200 and the storage battery 20 to terminate charging of the storage battery 20. If the actual current I is greater than or equal to the determination current, the calculation part 13 determines that the storage battery 20 is not fully charged. At this time, in the calculation part 13, the process returns to step S110.

The determination current is a determination value for determining whether or not the difference between the closed circuit voltage CCV detected by the voltage sensor 51 and the open circuit voltage OCV corresponding to the actual SOC of the storage battery 20 has become as small as possible. This determination current is a finite value close to OA. The value of the determination current can be appropriately determined by the manufacturer of the electric vehicle or the user of the electric vehicle.

When the rapid charge processing is finished and the full charge processing is started, the actual current I used for determination in step S160 does not reflect the decrease in the target current in step S140. Therefore, the calculation part 13 returns from step S160 to step S110. Then, the calculation part 13 executes the processing from step S110 again.

The calculation part 13 acquires the actual current I in step S110, but the reduction in the target current in step S140 is not necessarily reflected in this actual current I. This is because there is a delay in the response of the charge stand 200 with respect to changes in the target current.

Due to this response delay, the closed circuit voltage CCV and actual current I detected in step S110 immediately after the target current is reduced are almost different from the closed circuit voltage CCV and the actual current I detected in step S110 before the target current is reduced.

Therefore, as a result of the charge stand 200 responding to the reduced target current, as long as the actual current I follows this target current and the difference between the actual current and the target current does not become smaller than the predetermined current, the calculation part 13 advances from step S130 to step S150.

When proceeding to step S150, the calculation part 13 starts measuring a waiting time. The measurement of the standby time is started when it is first determined in step S130 that the difference value is equal to or greater than the predetermined current. The measurement of the standby time is started when the reduction of the target current is prohibited. After this process, in the calculation part 13, the process proceeds to step S170.

When proceeding to step S170, the calculation part 13 determines whether or not the waiting time has become equal to or longer than an expected response time. This expected response time is a time in which a reliable response is expected in the charge stand 200 regardless of the type of charge stand 200. The calculation part 13 may calculate the expected response time of the charge stand 200 connected to the electric vehicle, for example, during the rapid charge processing.

When the standby time is equal to or longer than the expected response time, the calculation part 13 determines that a reduction instruction of the target current to the charge stand 200 is delayed, and the process proceeds to step S180. When the waiting time is less than the expected response time, the calculation part 13 returns to step S110. At this time, the calculation part 13 repeats steps S110 to S120, or steps S110 to S130, steps S150, and steps S170. The calculation part 13 enters a standby state.

When the charge stand 200 normally responds to the decrease in the target current while the calculation part 13 is in the standby state, the actual current I changes to follow the target current. An actual current I corresponding to the reduced target current is detected in step S110. When the difference between the actual current I and the target current becomes smaller than the predetermined current, in the calculation part 13, the process proceeds from step S130 to step S140. In this step S140, the calculation part 13 reduces the target current again. By executing the processing described above, the target current is gradually decreased. The calculation part 13 resets the standby time when decreasing the target current again.

When the process proceeds to step S180 because the standby time is longer than the expected response time, the calculation part 13 forcibly reduces the target current included in the instruction signal that continues to be output to the charge stand 200. After this process, in the calculation part 13, the process proceeds to step S160.

The reduction amount of the target current in step S180 and the reduction amount of the target current in step S140 may be the same or different. In the present embodiment, the reduction amount of target current in step S180 is lower than the reduction amount of target current in step S140. The forcible reduction of the target current in step S180 is not reflected in the timing chart shown in FIG. 2.

<Operation and Effects>

As described above, when the closed circuit voltage CCV of the storage battery 20 becomes equal to or higher than the target voltage and the SOC of the storage battery 20 becomes equal to or higher than the target SOC during rapid charge processing, the calculation part 13 executes the full charge processing.

In the full charge processing, the calculation part 13 changes (decreases) the target current to be included in the instruction signal output to the charge stand 200. After that processing, when the difference between the actual current I and the target current becomes lower than the predetermined current, the calculation part 13 determines that the charge stand 200 has reduced the amount of current contained in the external power supplied to the storage battery 20 in accordance with the decrease in target current. Each time this determination is established, the calculation part 13 gradually decreases the target current.

Thus, the calculation part 13 reduces the target current during the full charge processing based on the actual dynamic response of the charge stand 200 during the full charge processing. Therefore, for example, compared to a configuration that reduces the target current during the full charge processing based on the temporary response of the charge stand 200 before the full charge processing, a rapid decrease in the target current during the full charge processing is suppressed. As a result, extension of the charge time of the storage battery 20 during the full charge processing is suppressed. Moreover, the voltage state of the storage battery 20 during the full charge processing is stabilized.

After decreasing the target current, the calculation part 13 forcibly decreases the target current if the difference between the actual current I and the target current does not become equal to or less than a predetermined current even after the expected response time has elapsed. By doing so, it is possible to prompt the charge stand 200 to respond. It is possible to facilitate the reduction of the actual current I.

(Modifications)

In the present embodiment, an example is shown in which the actual current I is used as the physical quantity for determining the responsiveness of the charge stand 200. However, the closed circuit voltage CCV can be used as the physical quantity for determining the responsiveness of the charge stand 200.

Figure 5:
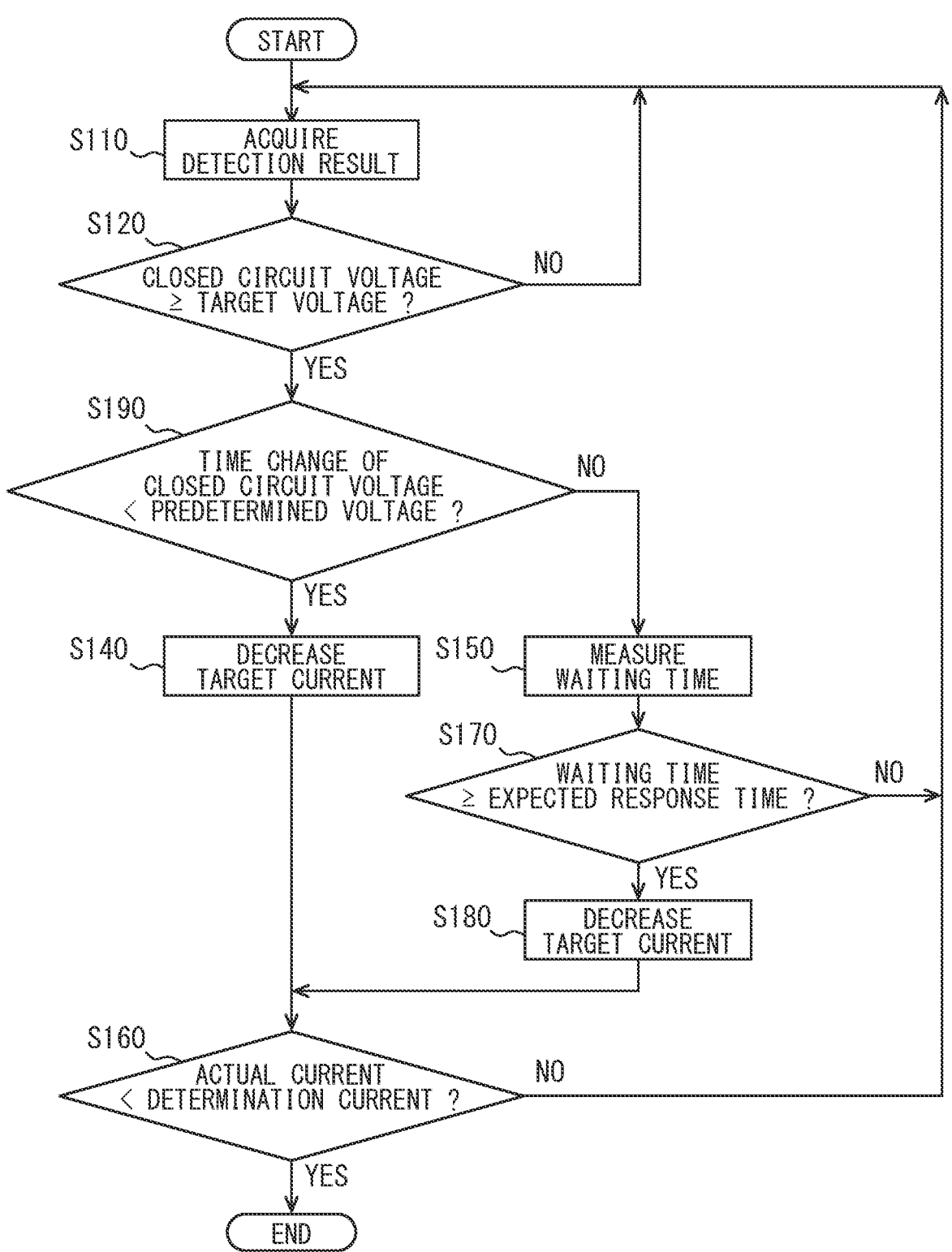
FIG. 5 is a flowchart for explaining a modification of full charge processing.

In the case of this modification, the calculation part 13 executes the full charge processing shown in FIG. 5. This full charge processing executes step S190 shown in FIG. 5 instead of step S130 of the full charge processing shown in FIG. 4.

In step S190, the calculation part 13 detects the time change of the closed circuit voltage CCV based on the closed circuit voltage CCV detected in the repeated step S110. This time change of the closed circuit voltage CCV is, for example, a value obtained by subtracting the closed circuit voltage CCV at time t2 from the closed circuit voltage CCV at time t3 shown in FIG. 2.

When the response of the charge stand 200 to the instruction signal is delayed, the time change of the closed circuit voltage CCV remains large. However, when the charge stand 200 responds to the instruction signal, it is expected that the time change of the closed circuit voltage CCV will become small.

Therefore, when the time change of the closed circuit voltage CCV is lower than a predetermined voltage, the calculation part 13 determines that the actual current I changes following the target current, and the process proceeds to step S140. When the time change of the closed circuit voltage CCV is equal to or greater than the predetermined voltage, the calculation part 13 determines that the actual current I does not follow the target current, and the process proceeds to step S150.

The predetermined voltage is determined based on the performance of the charge stand 200, the detection accuracy of the voltage sensor 51, and the like, in the same manner as the predetermined current. In this modification, the predetermined voltage corresponds to the predetermined value. The closed circuit voltage CCV corresponds to the physical quantity.

Although the present disclosure has been described in accordance with the embodiments, it is understood that the present disclosure is not limited to the above embodiments or structures. To the contrary, the present disclosure is intended to cover various modification and equivalent arrangements. In addition, while various combinations and modes are described in the present disclosure, other combinations and modes including only one element, more elements, or less elements therein are also within the scope and spirit of the present disclosure.

What is claimed is:

1. A charge control device, comprising:
a storage; and
a processor programmed to:
    acquire a detection result from a physical quantity sensor that detects a physical quantity related to charging of a storage battery mounted on a vehicle by external power output from an external power supply;
    change a target value of the physical quantity when (i) a charge amount of the storage battery is equal to or greater than a target charge quantity and (ii) a difference between the target value of the physical quantity and the detection result is lower than a predetermined value; and
    in response to the changing of the target value of the physical quantity, transmit an instruction signal including an instruction to control the external power based on the changed target value of the physical quantity, wherein
    the changing of the target value of the physical quantity includes reducing the target value when (i) a charge current amount of the storage battery is equal to or greater than a target charge current amount and (ii) a time during which the difference obtained by subtracting the charge current amount from the target charge current amount of the physical quantity is equal to or greater than the predetermined value has passed an expected response time of the external power supply, and
    the instruction signal causes the external power supply to adjust the external power output toward the target value of the physical quantity.

2. The charge control device according to claim 1, wherein
the processor is programmed to maintain the target value of the physical quantity unchanged, when the charge current amount of the storage battery is equal to or greater than the target charge current amount and the difference between the target value of the physical quantity and the detection result is equal to or greater than the predetermined value.

3. The charge control device according to claim 1, wherein
the processor is programmed to maintain the target value of the physical quantity unchanged, when a charge voltage of the storage battery is greater than a target charge voltage and the difference between the target value of the physical quantity and the detection result is equal to or greater than the predetermined value, the target value of the physical quantity is a target voltage, and the detection result is a detected voltage of the storage battery.

4. The charge control device according to claim 1, wherein
the physical quantity is at least one of a charge current flowing supplied to the storage battery and a voltage of the storage battery.

5. The charge control device according to claim 1, wherein
the predetermined value is determined based on a performance of said external power supply.

6. A method of controlling a charge control device, comprising:
acquiring a detection result from a physical quantity sensor that detects a physical quantity related to charging of a storage battery mounted on a vehicle by external power output from an external power supply;
changing a target value of the physical quantity when (i) a charge amount of the storage battery is equal to or greater than a target charge quantity and (ii) a difference between the target value of the physical quantity and the detection result is lower than a predetermined value; and
in response to the changing of the target value of the physical quantity, transmitting an instruction signal including an instruction to control the external power based on the changed target value of the physical quantity, wherein
    the changing of the target value of the physical quantity includes reducing the target value when (i) a charge current amount of the storage battery is equal to or greater than a target charge current amount and (ii) a time during which the difference obtained by subtracting the charge current amount from the target charge current amount of the physical quantity is equal to or greater than the predetermined value has passed an expected response time of the external power supply, and
    the instruction signal causes the external power supply to adjust the external power output toward the target value of the physical quantity.

7. A charge control device, comprising:
a computer including a processor and a memory that stores instructions configured to, when executed by the processor, cause the processor to
acquire a detection result from a physical quantity sensor that detects a physical quantity related to charging of a storage battery mounted on a vehicle by external power output from an external power supply;
change a target value of the physical quantity when (i) a charge amount of the storage battery is equal to or greater than a target charge quantity and (ii) a difference between the target value of the physical quantity and the detection result is lower than a predetermined value; and
in response to the changing of the target value of the physical quantity, transmit an instruction signal including an instruction to control the external power based on the changed target value of the physical quantity, wherein
    the changing of the target value of the physical quantity includes reducing the target value when (i) a charge current amount of the storage battery is equal to or greater than a target charge current amount and (ii) a time during which the difference obtained by subtracting the charge current amount from the target charge current amount of the physical quantity is equal to or greater than the predetermined value has passed an expected response time of the external power supply, and the instruction signal causes the external power supply to adjust the external power output toward the target value of the physical quantity.

\* \* \* \* \*